(12) United States Patent
Radkov et al.

(10) Patent No.: US 7,859,182 B2
(45) Date of Patent: *Dec. 28, 2010

(54) WARM WHITE LED-BASED LAMP INCOPORATING DIVALENT EU-ACTIVATED SILICATE YELLOW EMITTING PHOSPHOR

(75) Inventors: Emil Vergilov Radkov, Euclid, OH (US); Anant Achyut Setlur, Niskayuna, NY (US); Ilona Elisabeth Hausmann, Elyria, OH (US); Marisa L. Goodin, legal representative, Elyria, OH (US)

(73) Assignee: Lumination LLC, Cleveland, OH (US)

( * ) Notice: Subject to any disclaimer, the term of this patent is extended or adjusted under 35 U.S.C. 154(b) by 139 days.

This patent is subject to a terminal disclaimer.

(21) Appl. No.: 11/757,748

(22) Filed: Jun. 4, 2007

(65) Prior Publication Data
US 2007/0221938 A1    Sep. 27, 2007

Related U.S. Application Data

(63) Continuation-in-part of application No. 11/285,024, filed on Nov. 22, 2005, now Pat. No. 7,262,439, and a continuation-in-part of application No. 11/216,566, filed on Aug. 31, 2005, now Pat. No. 7,501,753.

(51) Int. Cl.
*H01J 33/00* (2006.01)
*C09K 11/77* (2006.01)
*C09K 11/79* (2006.01)
*C09K 11/54* (2006.01)

(52) U.S. Cl. ............... 313/484; 313/501; 313/512; 252/301.4 R; 252/301.6 R

(58) Field of Classification Search ............ 313/512, 313/485–487; 252/301.4 H, 301.4 F, 301.4 R, 252/301.6 R
See application file for complete search history.

(56) References Cited

U.S. PATENT DOCUMENTS

| | | | |
|---|---|---|---|
| 3,676,361 A | 7/1972 | Datta | |
| 7,138,756 B2 | 11/2006 | Gotoh et al. | |
| 7,201,858 B2 * | 4/2007 | Shida et al. | 252/301.4 F |
| 7,262,439 B2 * | 8/2007 | Setlur et al. | 257/98 |
| 7,497,973 B2 * | 3/2009 | Radkov et al. | 252/301.4 H |
| 7,501,753 B2 * | 3/2009 | Hancu et al. | 313/503 |

(Continued)

FOREIGN PATENT DOCUMENTS
DE    20 28 376 A1    12/1970
(Continued)

OTHER PUBLICATIONS

K. Uheda, et al., "Luminescence Properties of a Red Phosphor, $CaAlSiN_3:Eu^{2+}$, for White Light-Emitting Diodes", Electrochemical and Solid-State Letters, vol. 9 (40 H22-H25 (2006).

*Primary Examiner*—Mariceli Santiago
(74) *Attorney, Agent, or Firm*—Fay Sharpe LLP

(57) ABSTRACT

Light emitting apparatuses including warm white LED based lights including a semiconductor light source and a phosphor material including a yellow emitting phosphor, a red emitting phosphor, and, optionally, at least one of a green, blue or green-blue emitting phosphor.

25 Claims, 4 Drawing Sheets

U.S. PATENT DOCUMENTS

| | | |
|---|---|---|
| 2005/0189863 A1 | 9/2005 | Nagatomi et al. |
| 2006/0006782 A1 | 1/2006 | Nagatomi et al. |
| 2006/0017041 A1 | 1/2006 | Tian et al. |
| 2006/0043337 A1 | 3/2006 | Sakane et al. |
| 2006/0065878 A1 | 3/2006 | Sakane et al. |
| 2006/0081814 A1* | 4/2006 | Shida et al. ............ 252/301.4 F |
| 2006/0091790 A1 | 5/2006 | Nagatomi et al. |
| 2006/0197432 A1 | 9/2006 | Nagatomi et al. |
| 2006/0197439 A1 | 9/2006 | Sakane et al. |
| 2006/0220047 A1 | 10/2006 | Nagatomi et al. |
| 2006/0220520 A1 | 10/2006 | Sakane et al. |
| 2008/0251765 A1* | 10/2008 | Shida et al. ............ 252/301.4 R |

FOREIGN PATENT DOCUMENTS

| | | |
|---|---|---|
| DE | 102 59 946 A1 | 7/2004 |
| EP | 1 568 753 A2 | 8/2005 |
| EP | 1 568 753 A3 | 8/2005 |
| EP | 1 630 219 A2 | 3/2006 |
| EP | 1 696 016 A1 | 8/2006 |
| GB | 544160 | 3/1942 |
| JP | 2005054182 A | 3/2005 |
| JP | 2005060714 A | 3/2005 |
| JP | 2005226000 A | 8/2005 |
| JP | 20055336253 | 8/2005 |
| JP | 2006028295 A | 2/2006 |
| JP | 2006049799 A | 2/2006 |
| JP | 2006137902 A | 6/2006 |
| WO | WO 2004/055910 A1 | 7/2004 |
| WO | WO 2005/027231 A1 | 3/2005 |
| WO | WO 2005/044947 A2 | 5/2005 |
| WO | WO 2005/052087 A1 | 6/2005 |
| WO | WO 2005/061659 A1 | 7/2005 |
| WO | WO 2005/078811 A1 | 8/2005 |
| WO | WO 2005/103199 A1 | 11/2005 |
| WO | WO 2006/126567 A1 | 5/2006 |
| WO | WO 2006/077740 A1 | 7/2006 |
| WO | WO 2006/080535 A1 | 8/2006 |
| WO | WO 2006/117984 A1 | 11/2006 |

* cited by examiner

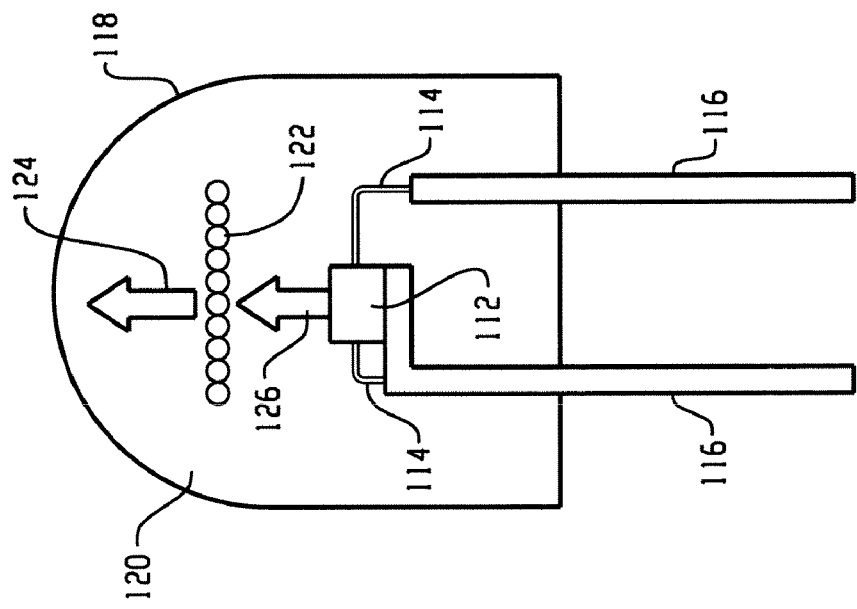
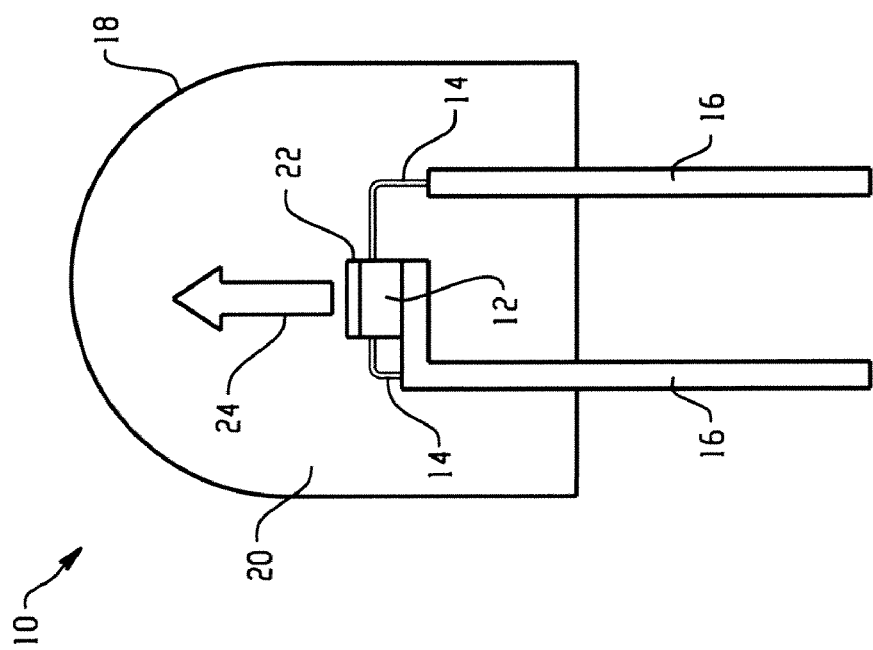

WARM WHITE LED-BASED LAMP INCOPORATING DIVALENT EU-ACTIVATED SILICATE YELLOW EMITTING PHOSPHOR

This application is a continuation-in-part and claims the benefit of prior U.S. patent application Ser. Nos. 11/285,024, filed on Nov. 22, 2005, now U.S. Pat. No. 7,262,439 and Ser. No. 11/216,566, filed on Aug. 31, 2005 now U.S. Pat. No. 7,501,753.

BACKGROUND

The present exemplary embodiments relate to phosphor compositions, particularly phosphors for use in lighting applications. More particularly, the present embodiments relate to phosphor blends and a warm white lighting apparatus employing these blends.

Light emitting diodes (LEDs) are semiconductor light emitters often used as a replacement for other light sources, such as incandescent lamps. They are particularly useful as display lights, warning lights and indicator lights or in other applications where colored light is desired. The color of light produced by an LED is dependent on the type of semiconductor material used in its manufacture.

Colored semiconductor light emitting devices, including light emitting diodes and lasers (both are generally referred to herein as LEDs), have been produced from Group III-V alloys such as gallium nitride (GaN). With reference to the GaN-based LEDs, light is generally emitted in the UV to green range of the electromagnetic spectrum. Until quite recently, LEDs have not been suitable for lighting uses where a bright white light is needed, due to the inherent color of the light produced by the LED.

Recently, techniques have been developed for converting the light emitted from LEDs to useful light for illumination purposes. In one technique, the LED is coated or covered with a phosphor layer. A phosphor is a luminescent material that absorbs radiation energy in a portion of the electromagnetic spectrum and emits energy in another portion of the electromagnetic spectrum. Phosphors of one important class are crystalline inorganic compounds of very high chemical purity and of controlled composition to which small quantities of other elements (called "activators") have been added to convert them into efficient fluorescent materials. With the right combination of activators and inorganic compounds, the color of the emission can be controlled. Most useful and well-known phosphors emit radiation in the visible portion of the electromagnetic spectrum in response to excitation by electromagnetic radiation outside the visible range.

By interposing a phosphor excited by the radiation generated by the LED, light of a different wavelength, e.g., in the visible range of the spectrum, may be generated. Colored LEDs are often used in toys, indicator lights and other devices. Continuous performance improvements have enabled new applications for LEDs of saturated colors in traffic lights, exit signs, store signs, and the like.

In addition to colored LEDs, a combination of LED generated light and phosphor generated light may be used to produce white light. The most popular white LEDs consist of blue emitting GaInN chips. The blue emitting chips are coated with a phosphor that converts some of the blue radiation to a complementary color, e.g. a yellowish emission. Together, the blue and yellowish radiation produces a white light. There are also white LEDs that utilize a near UV emitting chip and a phosphor blend including red, green and blue emitting phosphors designed to convert the UV radiation to visible light.

Known white light emitting devices include those comprising a blue light-emitting LED having a peak emission wavelength in the near blue range (from about 440 nm to about 480 nm) combined with a yellow light-emitting phosphor, such as cerium(III) doped yttrium aluminum garnet ("YAG:Ce"), a cerium(III) doped terbium aluminum garnet ("TAG:Ce"), or a europium(II) doped barium orthosilicate ("BOS"). The phosphor absorbs a portion of the radiation emitted from the LED and converts the absorbed radiation to a yellow light. The remainder of the blue light emitted by the LED is transmitted through the phosphor and is mixed with the yellow light emitted by the phosphor. A viewer perceives the mixture of blue and yellow light as a white light. The total of the light from the phosphor material and the LED chip provides a color point with corresponding color coordinates (x and y) and correlated color temperature (CCT), and its spectral distribution provides a color rendering capability, measured by the color rendering index (CRI).

Such systems can be used to make white light sources having CCTs of >4500 K and CRIs ranging from about 70-82, with luminous efficacy of radiation ("LER", also referred to as luminosity) of about 330 $lm/W_{opt}$. While this range is suitable for many applications, general illumination sources usually require lower CCTs and higher CRIs, preferably with similar or better LER.

Other white light LED lighting systems use a UV or visible light LED chip along with a blend of red, green, and/or blue phosphors that can be efficiently excited by near-UV radiation to make white light.

The CRI is commonly defined as a mean value for 8 standard color samples ($R_{1-8}$), usually referred to as the General Color Rendering Index and abbreviated as $R_a$, although 14 standard color samples are specified internationally and one can calculate a broader CRI ($R_{1-14}$) as their mean value. In particular, the $R_9$ value, measuring the color rendering for the strong red, is very important for a range of applications, especially of medical nature.

Recently there has been a great deal of interest in "warm white" (CCT<4500) LED lights to replace incandescent lights. Among the possible solutions, those using phosphors have proven the simplest and easiest to implement. Due to the inherently high CRI of incandescent lights (100 by definition), a fairly high CRI (e.g. 80 or greater, more preferably 90 or greater) is also expected from warm white LEDs for general illumination. However, certain applications do not require such a high CRI and may be designed to lower CRI value in exchange for higher LER, as explained further below.

Phosphor blends for warm white LEDs based on blue to UV chips are known in the art. However, there is a considerable drop in LED efficiency as the CCT is lowered towards incandescent values, leading to a performance gap between "cool" and "warm" white LEDs at any given CRI. There is also a general trade-off relationship between CRI and LER, of approximately 1% LER lost per 1 CRI point gained. Then the efficacy (i.e. the luminous flux output per electrical watt input, as commonly reported in the art) is proportional to the LER value. Current state of the art commercial power warm white LEDs have efficacies around 35 lm/W at low CRI (e.g. 70), and around 28 lm/W or less at high CRI (e.g. 90), in line with the trade-off relationship mentioned above.

Thus, a continuing need exists for warm white lamps (preferably LED lamps) with improved efficiency and having the ability to customize CRI vs. LER at low CCT values.

BRIEF SUMMARY

In a first aspect, there is provided a white light emitting device including a light source and a phosphor material comprising a red emitting phosphor having the formula $Ca_{1-2e-f}Ce_e(Li,Na)_eEu_fAlSiN_3$, where $0 \leq e \leq 0.2$, $0 \leq f \leq 0.2$, $e+f>0$; or $Ca_{1-g-h-i}Ce_g(Li,Na)_hEu_iAl_{1+g-h}Si_{1-g+h}N_3$ where $0 \leq g \leq 0.2$, $0 \leq h \leq 0.4$, $0 \leq i \leq 0.2$, $g+i>0$; a yellow emitting phosphor having peak emission in the range of about 550 to 610 nm; and at least one of a blue, green, or blue-green emitting phosphor having peak emission in the range of about 440 to 550 nm.

In a second aspect, there is provided a phosphor material comprising a red emitting phosphor having the formula $Ca_{1-2e-f}Ce_e(Li,Na)_eEu_fAlSiN_3$, where $0 \leq e \leq 0.2$, $0 \leq f \leq 0.2$, $e+f>0$; or $Ca_{1-g-h-i}Ce_g(Li,Na)_hEu_iAl_{1+g-h}Si_{1-g+h}N_3$ where $0 \leq g \leq 0.2$, $0 < h \leq 0.4$, $0 \leq i \leq 0.2$, $g+i>0$; a yellow emitting phosphor having peak emission in the range of about 550 to 610 nm; and at least one of a blue, green, or blue-green emitting phosphor having peak emission in the range of about 440 to 550 nm.

In a third aspect, there is provided a white light emitting device including a light source and a phosphor material comprising a yellow emitting phosphor $(Mg,Ca,Sr,Ba,Zn)_2Si_{1-x}O_{4-2x}:Eu^{2+}$ (wherein $0<x \leq 0.2$), a red emitting phosphor having peak emission in the range of about 610 to 660 nm, and an optional blue, green, or blue-green emitting phosphor having peak emission in the range of about 440 to 550 nm.

In a fourth aspect, there is provided a phosphor material comprising a yellow emitting phosphor $(Mg,Ca,Sr,Ba,Zn)_2Si_{1-x}O_{4-2x}:Eu^{2+}$ (wherein $0<x \leq 0.2$), a red emitting phosphor having peak emission in the range of about 610 to 660 nm, and an optional blue, green, or blue-green emitting phosphor having peak emission in the range of about 440 to 550 nm.

BRIEF DESCRIPTION OF THE DRAWINGS

FIG. 1 is a schematic cross-sectional view of an illumination system in accordance with one embodiment of the present invention.

FIG. 2 is a schematic cross-sectional view of an illumination system in accordance with a second embodiment of the present invention.

DETAILED DESCRIPTION OF THE EXEMPLARY EMBODIMENTS

Figure 4:
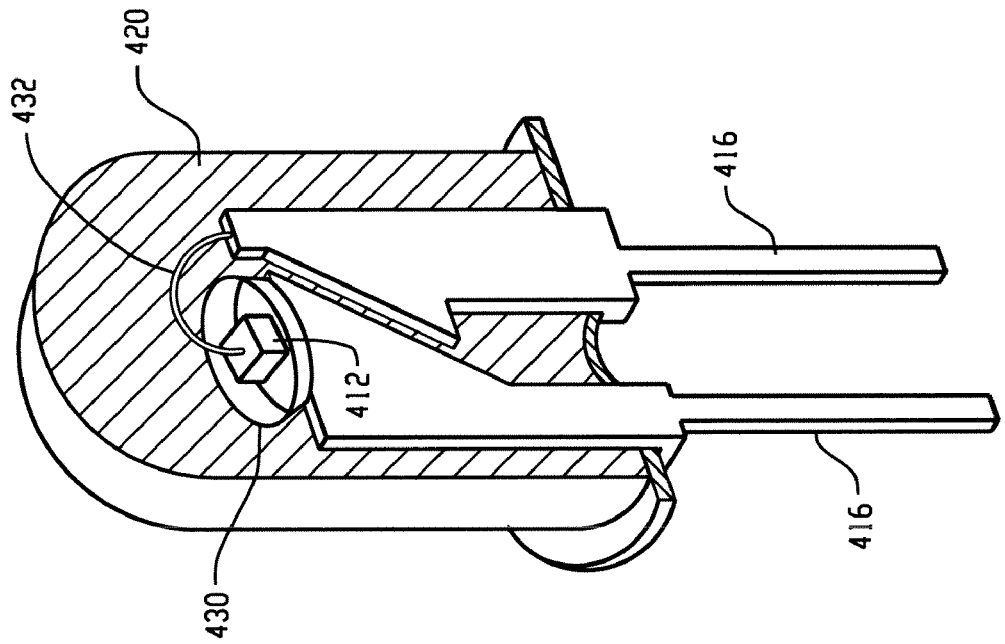
FIG. 4 is a cutaway side perspective view of an illumination system in accordance with a fourth embodiment of the present invention.

Phosphors convert radiation (energy) to visible light. Different combinations of phosphors provide different colored light emissions. Novel phosphors and blends are presented herein as well as their use in LED and other light sources.

The color of the generated visible light is dependent on the particular components of the phosphor material. The phosphor material may include only a single phosphor or two or more phosphors of basic color, for example a particular mix with one or more of a yellow and red phosphor to emit a desired color (tint) of light. As used herein, the terms "phosphor" and "phosphor material" may be used to denote both a single phosphor as well as a blend of two or more phosphor.

It was determined that a lamp that produces warm white light containing a phosphor material capable of efficiently converting at least part of the radiation from a light source into a warm white light with customized CRI would be useful in general lighting applications. Preferred examples for various embodiments will be provided further below.

Preferably, three or more phosphors can be used in the above phosphor material. Therefore, in one embodiment, a luminescent conversion material blend (phosphor blend) coated LED chip is disclosed for providing white light. The phosphor blends presented in this embodiment enable white light with an optimal combination of CRI and LER at any CCT of interest, when excited by radiation having a peak wavelength in the region of from about 250 to 450 nm as emitted by a near UV to violet light source, either alone or in combination with any residual bleed from the light source.

With reference to FIG. 1, an exemplary LED based light emitting assembly or lamp 10 is shown in accordance with one preferred structure of the present invention. The light emitting assembly 10 comprises a semiconductor UV or visible radiation source, such as a light emitting diode (LED) chip 12 and leads 14 electrically attached to the LED chip. The leads 14 may comprise thin wires supported by a thicker lead frame(s) 16 or the leads may comprise self-supported electrodes and the lead frame may be omitted. The leads 14 provide current to the LED chip 12 and thus cause the LED chip 12 to emit radiation.

The lamp may include any visible or UV light source that is capable of producing white light when its emitted radiation is directed onto the phosphor. An exemplary light source is an LED or other semiconductor light source. Thus, an LED will be used herein for discussion purposes, however other light sources are also contemplated. The preferred peak emission of the LED chip in the present invention will depend on the identity of the phosphors in the disclosed embodiments and may range from, e.g., 250-450 nm. In one preferred embodiment, however, the emission of the LED will be in the near UV to violet region and have a peak wavelength in the range from about 370 to about 440 nm. Typically then, the semiconductor light source comprises an LED doped with various impurities. Thus, the LED may comprise a semiconductor diode based on any suitable III-V, II-VI or IV-IV semiconductor layers and having a peak emission wavelength of about 250 to 450 nm.

Preferably, the LED may contain at least one semiconductor layer comprising GaN, AlN or SiC. For example, the LED may comprise a nitride compound semiconductor represented by the formula $In_iGa_jAl_kN$ (where $0 \leq i$; $0 \leq j$; $0 \leq k$ and $i+j+k=1$) having a peak emission wavelength greater than about 250 nm and less than about 450 nm. Such LED semiconductors are known in the art. The radiation source is described herein as an LED for convenience. However, as used herein, the term is meant to encompass all semiconductor radiation sources including, e.g., semiconductor laser diodes.

Although the general discussion of the exemplary structures of the invention discussed herein are directed toward inorganic LED based light sources, it should be understood that the LED chip may be replaced by an organic light emissive structure or any other radiation source unless otherwise noted and that any reference to LED chip or semiconductor is merely representative of any appropriate radiation source.

The LED chip 12 may be encapsulated within a shell 18, which encloses the LED chip and an encapsulant material 20. The shell 18 may be, for example, glass or plastic. Preferably, the LED 12 is substantially centered in the encapsulant 20. The encapsulant 20 is preferably an epoxy, plastic, low temperature glass, polymer, thermoplastic, thermoset material, resin or other type of LED encapsulating material as is known in the art. Optionally, the encapsulant 20 is a spin-on glass or some other material having a high index of refraction. In one embodiment, the encapsulant material 20 is a polymer material, such as epoxy, silicone, or silicone epoxy, although other organic or inorganic encapsulants may be used. Both the shell 18 and the encapsulant 20 are preferably transparent or substantially optically transmissive with respect to the wavelength of light produced by the LED chip 12 and a phosphor material 22 (described below). In an alternate embodiment, the lamp 10 may only comprise an encapsulant material without an outer shell 18. The LED chip 12 may be supported, for example, by the lead frame 16, by the self supporting electrodes, the bottom of the shell 18, or by a pedestal (not shown) mounted to the shell or to the lead frame.

The structure of the illumination system includes a phosphor material 22 radiationally coupled to the LED chip 12. Radiationally coupled means that the elements are associated with each other so that at least part of the radiation emitted from one is transmitted to the other.

This phosphor material 22 is deposited on the LED 12 by any appropriate method. For example, a suspension of the phosphor(s) can be formed, and applied as a phosphor layer to the LED surface. In one such method, a silicone, epoxy or other matrix material is used (either directly or diluted with an organic solvent, e.g. acetone, MIBK or butyl acetate) to create a slurry in which the phosphor particles are randomly suspended and placed around the LED. This method is merely exemplary of possible positions of the phosphor material 22 and LED 12. Thus, the phosphor material 22 may be coated over or directly on the light emitting surface of the LED chip 12 by coating and drying or curing the phosphor suspension over the LED chip 12. Both the shell 18 and the encapsulant 20 should be transparent to allow light 24 to be transmitted through those elements. Although not intended to be limiting, the median particle size of the phosphor material as measured using light scattering methods or via microscope (electron or optical) measurements may be from about 1 to about 20 microns.

FIG. 2 illustrates a second preferred structure of the apparatus according to the preferred aspect of the present invention. Corresponding numbers from FIGS. 1-4 (e.g. 12 in FIG. 1 and 112 in FIG. 2) relate to corresponding structures in each of the figures unless otherwise stated. The structure of the embodiment of FIG. 2 is similar to that of FIG. 1, except that the phosphor material 122 is interspersed within the encapsulant material 120, instead of being formed directly on the LED chip 112. The phosphor material (in the form of a powder) may be interspersed within a single region of the encapsulant material 120 or, more preferably, throughout the entire volume of the encapsulant material. Radiation 126 emitted by the LED chip 112 mixes with the light emitted by the phosphor material 122, and the mixed light appears as white light 124. If the phosphor is to be interspersed within the encapsulant material 120, then a phosphor powder may be added to a polymer precursor, loaded around the LED chip 112, and then the polymer precursor may be cured to solidify the polymer material. Other known phosphor interspersion methods may also be used, such as transfer molding.

Figure 3:
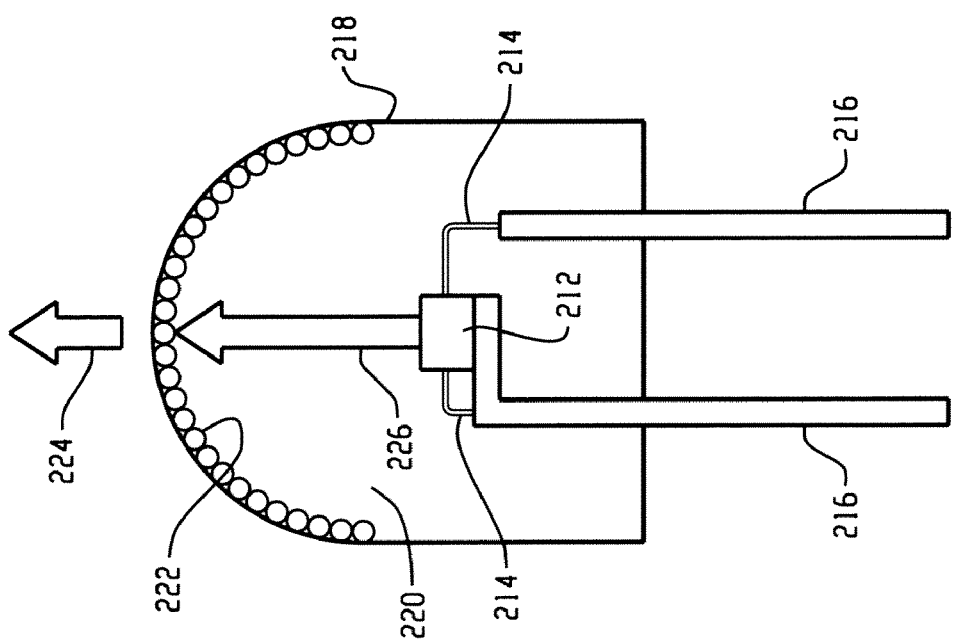
FIG. 3 is a schematic cross-sectional view of an illumination system in accordance with a third embodiment of the present invention.

FIG. 3 illustrates a third preferred structure of the apparatus according to the preferred aspects of the present invention. The structure of the embodiment shown in FIG. 3 is similar to that of FIG. 1, except that the phosphor material 222 is coated onto a surface of the shell 218, instead of being formed over the LED chip 212. The phosphor material is preferably coated on the inside surface of the shell 218, although the phosphor may be coated on the outside surface of the shell, if desired. The phosphor material 222 may be coated on the entire surface of the shell or only a top portion of the surface of the shell. The radiation 226 emitted by the LED chip 212 mixes with the light emitted by the phosphor material 222, and the mixed light appears as white light 224. Of course, the structures of FIGS. 1-3 may be combined and the phosphor may be located in any two or all three locations or in any other suitable location, such as separately from the shell or integrated into the LED.

In any of the above structures, the lamp 10 may also include a plurality of scattering particles (not shown), which are embedded in the encapsulant material. The scattering particles may comprise, for example, $Al_2O_3$ particles (such as alumina powder) or $TiO_2$ particles. The scattering particles effectively scatter the coherent light emitted from the LED chip, preferably with a negligible amount of absorption.

As shown in a fourth preferred structure in FIG. 4, the LED chip 412 may be mounted in a reflective cup 430. The cup 430 may be made from or coated with a reflective material, such as alumina, titania, or other dielectric powder known in the art. A preferred reflective material is $Al_2O_3$. The remainder of the structure of the embodiment of FIG. 4 is the same as that of any of the previous Figures, and includes two leads 416, a conducting wire 432 electrically connecting the LED chip 412 with the second lead, and an encapsulant material 420.

In one embodiment, there is provided three or four component phosphor blends that may be used as the phosphor material in the above described devices.

In one embodiment, the blend includes at least a deep red phosphor, a yellow emitting phosphor, and, optionally, at least one of a blue, green, or blue-green emitting phosphor. In a preferred embodiment, the yellow emitting phosphor has a peak emission in the range of from about 550-610 nm when excited by radiation from the light source. In a preferred embodiment, the red emitting phosphor has a peak emission in the range of from about 610-660 nm. Preferably, the blue, green or blue-green emitting phosphor has a peak emission in the range of from about 440-550. Suitable phosphors include those that are able to efficiently absorb radiation emitted by the semiconductor light source, e.g. able to efficiently absorb radiation having a peak wavelength in the range of from about 250 to 450 nm.

A preferred group of red emitting phosphors are nitride phosphors doped with at least one of $Eu^{2+}$ and $Ce^{3+}$. Additional examples of suitable phosphors are disclosed in commonly owned copending patent application Ser. No. 11/285,024, filed Nov. 22, 2005, the disclosure of which is incorporated herein by reference in its entirety. As disclosed therein, suitable phosphors can have the following formulas: $Ca_{1-2e-f}Ce_e(Li,Na)_eEu_fAlSiN_3$, where $0 \leq e \leq 0.2$, $0 \leq f \leq 0.2$, $e+f>0$; or $Ca_{1-g-h-i}Ce_g(Li,Na)_hEu_iAl_{1+g-h}Si_{1-g+h}N_3$ where $0 \leq g \leq 0.2$, $0 < h \leq 0.4$, $0 \leq i \leq 0.2$, $g+i>0$. An exemplary phosphor for use as the deep red phosphor in the present embodiments is $Ca_{0.88}Eu_{0.02}Li_{0.1}Al_{0.9}Si_{1.1}N_3$, which may be referred to herein as "CALI".

A non-limiting example of suitable yellow emitting phosphors include silicates doped with at least one of $Eu^{2+}$ and $Ce^{3+}$, e.g. alkaline earth orthosilicates having the general formula $(Mg,Ca,Sr,Ba,Zn)_2Si_{1-x}O_{4-2x}:Eu^{2+}$ (wherein $0 \leq x \leq 0.2$). Particularly useful are "off-stoichiometric" phosphors of the above formula wherein x>0. Additional examples of suitable phosphors include those disclosed in commonly owned copending patent application Ser. Nos. 11/216,566, filed on Aug. 31, 2005 and 10/797,784, filed on Mar. 10, 2004, the disclosures of which are incorporated herein in their entirety.

With respect to the above formula, off-stoichoimetric phosphors (wherein x>0) are preferred. Some more preferred phosphors can be described by the formula $Sr_{2-u-e}Ca_uEu_eSi_{1-x}O_{4-2x}$ where $0.25 \leq u \leq 0.50$, $0.01 \leq e \leq 0.06$ and $0.02 \leq x \leq 0.20$, with some particularly preferred examples being $Sr_{1.73}Ca_{0.25}Eu_{0.02}Si_{0.92}O_{3.84}$, $Sr_{1.68}Ca_{0.30}Eu_{0.02}Si_{0.92}O_{3.84}$, and $Sr_{1.56}Ca_{0.40}Eu_{0.04}Si_{0.96}O_{3.92}$. An exemplary phosphor for use as the yellow phosphor in the present embodiments is $Sr_{1.66}Ca_{0.30}Eu_{0.04}Si_{0.96}O_{3.92}$, which may be referred to herein as "SASI".

Suitable green, blue or blue-green emitting phosphors include those known in the art as suitable for use in LED based lighting applications. A non-limiting exemplary class of phosphors includes alkaline earth haloapatites activated with $Eu^{2+}$, e.g. $(Mg,Ca,Sr,Ba,Zn)_5(PO_4)_3Cl:Eu^{2+}$ and alkaline earth aluminates activated with $Eu^{2+}$, e.g. $(Ba,Sr,Ca)MgAl_{10}O_{17}:Eu^{2+}$. Exemplary phosphors used in the present embodiments include $(Sr,Ba,Ca)_5(PO_4)_3Cl:Eu^{2+}$ ("SECA") and/or $(Ca,Ba)_5(PO_4)_3Cl:Eu^{2+}$ ("BECA").

It may be desirable to add pigments or filters to the phosphor material. When the light source is a UV emitting LED, the phosphor material may also comprise from 0 up to about 5% by weight (based on the total weight of the phosphors) of a pigment or other UV absorbent material capable of absorbing or reflecting UV radiation having a wavelength between 250 nm and 450 nm.

Suitable pigments or filters include any of those known in the art that are capable of absorbing radiation generated between 250 nm and 450 nm. Such pigments include, for example, nickel titanate or praseodymium zirconate. The pigment is used in an amount effective to filter 10% to 100% of the radiation generated in any of the 250 nm to 450 nm range.

The relative amounts of each phosphor in the phosphor material can be described in terms of spectral weight. The spectral weight is the relative amount that each phosphor contributes to the overall emission spectra of the phosphor blend. The spectral weight amounts of all the individual phosphors should add up to 1 (i.e. 100%). A preferred blend comprises a spectral weight of from about 20 to 75% of the yellow emitting phosphor, from about 0.5 to 20% of the deep red phosphor and the balance of the blend being one or more of a blue, green, and/or blue-green phosphor.

It should be noted that various phosphors are described herein in which different elements enclosed in parentheses and separated by commas, such as in the case of $(Ca,Ba)_5(PO_4)_3Cl:Eu^{2+}$. As understood by those skilled in the art, this type of notation means that the phosphor can include any or all of those specified elements in the formulation in any ratio. That is, this type of notation for the above phosphor, for example, has the same meaning as $(Ca_{1-x}Ba_x)_5(PO_4)_3Cl:Eu^{2+}$, where $0 \leq x \leq 1$.

As used herein, the terms "lamp", "device" and "apparatus" may be used interchangeably and are meant to include not only embodiments incorporating a single light source, but also arrangements of two or more light sources, e.g. LEDs on a circuit board or in another type of array, or other multiple light sources.

In addition, other phosphors emitting throughout the visible spectrum region, at wavelengths similar or different from those of the phosphors described in the present invention, may be used in the blend to customize the color of the resulting light and produce sources with improved light quality. While not intended to be limiting, suitable phosphors for use in the blend with the present phosphors include:

$(Ba,Sr,Ca)_5(PO_4)_3(Cl,F,Br,OH):Eu^{2+},Mn^{2+}$ $(Ba,Sr,Ca)BPO_5:Eu^{2+},Mn^{2+}$ $Sr_2Si_3O_8*2SrCl_2:Eu^{2+}$ $(Ca,Sr,Ba)_3MgSi_2O_8:Eu^{2+},Mn^{2+}$ $BaAl_8O_{13}:Eu^{2+}$ $2SrO*0.84P_2O_5*0.16B_2O_3:Eu^{2+}$ $(Ba,Sr,Ca)MgAl_{10}O_{17}:Eu^{2+},Mn^{2+}$ $(Ba,Sr,Ca)Al_2O_4:Eu^{2+}$ $(Y,Gd,Lu,Sc,La)BO_3:Ce^{3+},Tb^{3+}$ $(Ba,Sr,Ca)_2(Mg,Zn)Si_2O_7:Eu^{2+}$ $(Sr,Ca,Ba)(Al,Ga,In)_2S_4:Eu^{2+}$ $(Lu,Sc,Y,Tb)_{2-u-v}Ce_vCa_{1+u}Li_wMg_{2-w}P_w(Si,Ge)_{3-w}O_{12-u/2}$ where $-0.5 \leq u \leq 1$; $0 < v \leq 0.1$; and $0 \leq w \leq 0.2$ $(Ca,Sr)_8(Mg,Zn)(SiO_4)_4Cl_2:Eu^{2+},Mn^{2+}$ $Na_2Gd_2B_2O_7:Ce^{3+},Tb^{3+}$ $(Sr,Ca,Ba,Mg,Zn)_2P_2O_7:Eu^{2+},Mn^{2+}$ $(Gd,Y,Lu,La)_2O_3:Eu^{3+},Bi^{3+}$ $(Gd,Y,Lu,La)_2O_2S:Eu^{3+},Bi^{3+}$ $(Gd,Y,Lu,La)VO_4:Eu^{3+},Bi^{3+}$ $(Ca,Sr)S:Eu^{2+},Ce^{3+}$ $ZnS:Cu^+,Cl^-$ $ZnS:Cu^+,Al^{3+}$ $ZnS:Ag^+,Cl^-$ $ZnS:Ag^+,Al^{3+}$ $SrY_2S_4:Eu^{2+}$ $CaLa_2S_4:Ce^{3+}$ $(Ba,Sr,Ca)MgP_2O_7:Eu^{2+},Mn^{2+}$ $(Y,Lu)_2WO_6:Eu^{3+},Mo^{6+}$ $Ca_3(SiO_4)Cl_2:Eu^{2+}$ $(Lu,Ca,Li,Mg,Y)$alpha-SiAlON doped with $Eu^{2+}$ and/or $Ce^{3+}$ $(Ca,Sr,Ba)SiO_2N_2:Eu^{2+},Ce^{3+}$ For purposes of the present application, it should be understood that when a phosphor has two or more dopant ions (i.e. those ions following the colon in the above phosphors), this is to mean that the phosphor has at least one (but not necessarily all) of those dopant ions within the material. That is, as understood by those skilled in the art, this type of notation means that the phosphor can include any or all of those specified ions as dopants in the formulation.

The ratio of each of the individual phosphors in the phosphor blend may vary depending on the characteristics of the desired light output. The relative proportions of the individual phosphors in the various embodiment phosphor blends may be adjusted such that when their emissions are blended and employed in an lighting device, there is produced visible light of predetermined x and y values on the CIE chromaticity diagram. As stated, a warm white light is preferably produced. This white light may, for instance, may possess a CCT value of less than 4500K, preferably less than 3500K. Preferably, this light will also have a general CRI (Ra) index of 80 or greater, and more preferably 90 or greater, as needed for a particular application. Since the efficiency of individual phosphors may vary widely, the exact amounts of each phosphor needed are best determined empirically, e.g. through standard design of experiment (DOE) techniques.

EXAMPLES

Various LED based lighting devices were prepared using different phosphor blends. Specifically blends of SASI, CALI and SECA were prepared as well as blends of SASI, CALI and BECA phosphors. The SASI/CALI/SECA blends produced relatively low CRI devices (in the range of from 60 to 70), while the SASI/CALI/BECA blends produced devices with relatively high CRI (in the range of from about 90 to 99). Since a tradeoff exists between the CRI and the LPW, the CRI can be tailored to meet the minimum value needed by the customers by adjusting the content of blue, green or blue-green phosphors in the blends.

Nevertheless, devices having 30+lm/W at 2700K and 90+CRI, and 40+lm/W at 2700K and 60+CRI were produced. The phosphor blends described herein enable higher lm/W values, e.g. 40+lm/W at 2700K and 66 CRI, and 30+lm/W at 2700K and 93 CRI, when used with high efficiency violet chips (e.g. having 30%+external quantum efficiency at 350 mA drive current).

Figure 5:
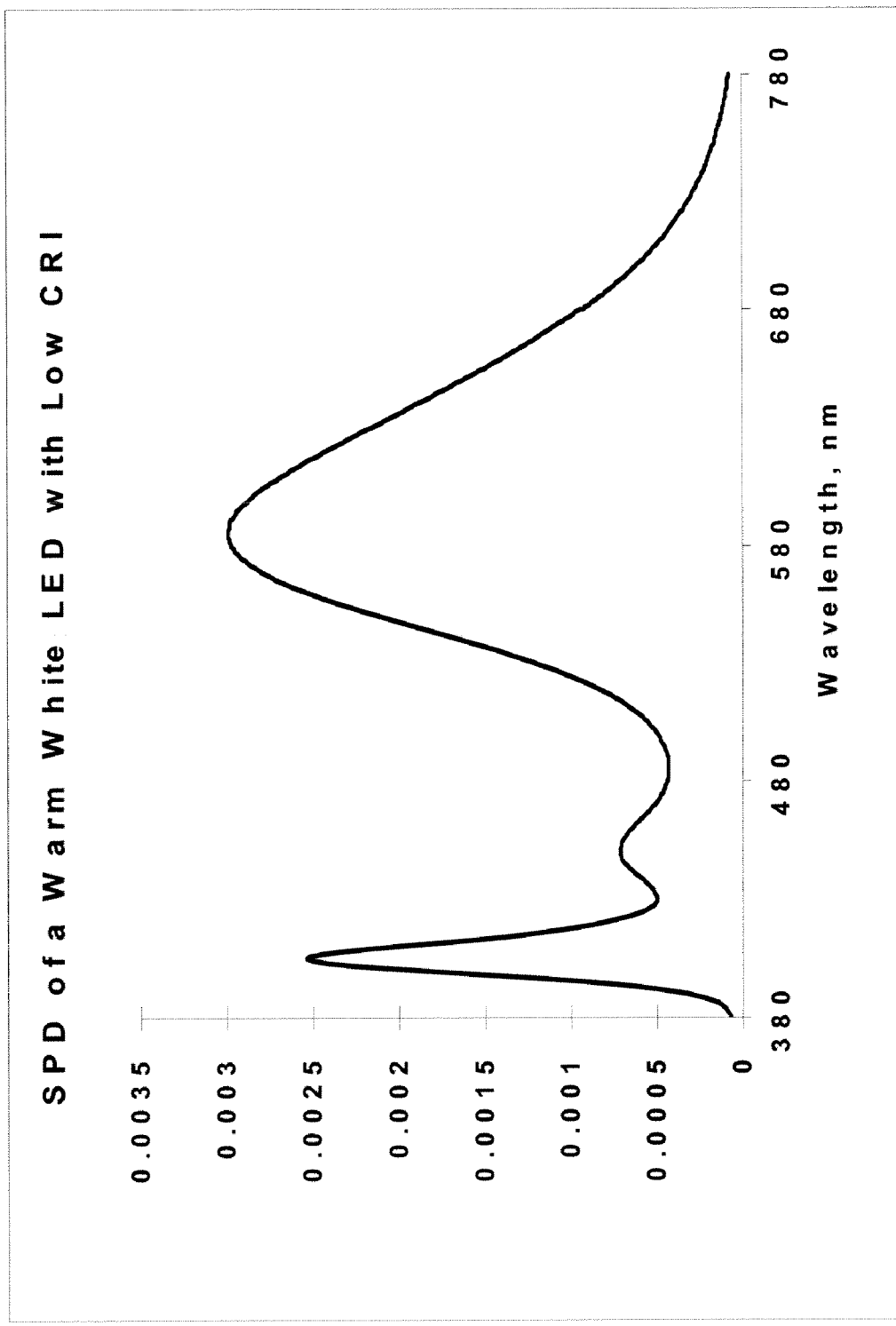
FIG. 5 is the emission spectrum of a low CRI lighting device according to one embodiment of the present invention.

FIG. 5 shows the emission spectrum of a warm white LED having a low CRI (Ra) of 66 made using a chip having a peak wavelength in the range of 400-405 nm and a phosphor blend including 59% SASI, 40% SECA and 1% CALI by weight. This device has x and y coordinates on the CIE color diagram of 0.463 and 0.408, respectively, a CCT of 2629 K and efficacy of 40.4 lm/W.

Figure 6:
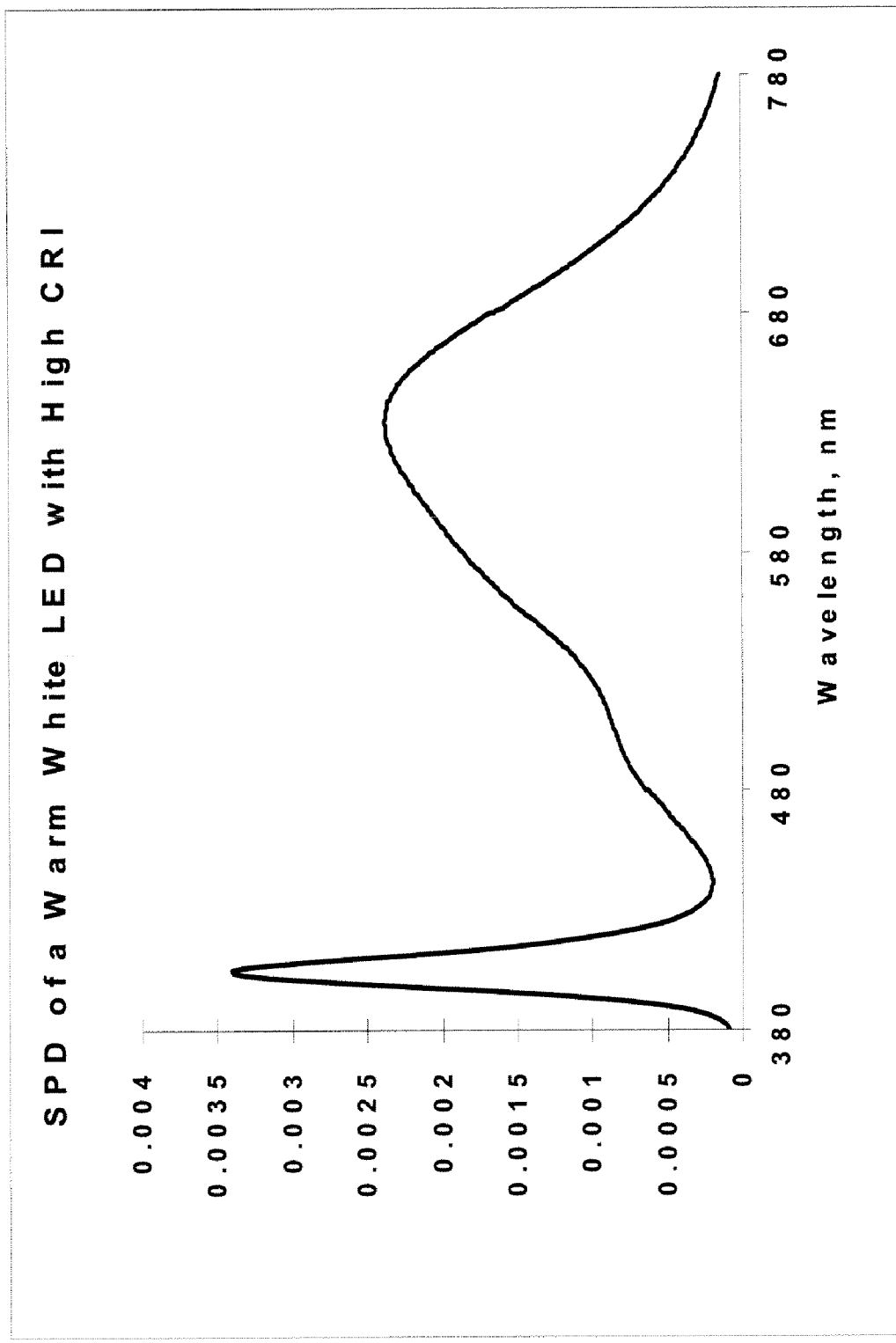
FIG. 6 is the emission spectrum of a high CRI lighting device according to another embodiment of the present invention.

FIG. 6 shows the emission spectrum of a warm white LED having a high CRI (Ra) of 92 made using a chip having a peak wavelength in the range of 400-405 nm and a phosphor blend including 65% BECA, 29% SASI and 6% CALI by weight. This device has x and y coordinates on the CIE color diagram of 0.453 and 0.414, respectively, a CCT of 2827 K and efficacy of 30.8 lm/W.

If needed, warm white LEDs having intermediate CRI values can be obtained, by using a blend of 4 or more phosphors (e.g. the SECA, BECA, SASI and CALI phosphors from the previous examples), or by using a phosphor of the general formula $(Mg,Ca,Sr,Ba,Zn)_5(PO_4)_3Cl:Eu^{2+}$ having a peak emission wavelength between those of the SECA and BECA phosphors in a blend with the other two phosphors (SASI and CALI). Thus, the CRI of the devices can be adjusted to any predetermined intermediate Ra value (e.g. 80), e.g. in order to meet a minimum CRI requirement for any given application, such as an undercabinet light, an outdoor light, or the like.

Apart from white light blends for general illumination, these phosphor materials described above may be used in additional applications besides LEDs. For example, the material may be used as a phosphor in an indicator lamp, in a luminescent panel, etc. These uses are meant to be merely exemplary and not exhaustive.

The present development has been described with reference to various exemplary embodiments. Modifications and alteration will occur to others upon a reading and understanding of this specification. The invention is intended to include all such modifications and alterations insofar as they come within the scope of the appended claims or the equivalent thereof.

What is claimed is:

1. A lighting apparatus for emitting light comprising: a light source; and a phosphor material radiationally coupled to the light source and capable of converting at least a portion of the radiation emitted by the light source into light having a different wavelength, said phosphor material comprising:
   a yellow emitting phosphor $(Mg,Ca,Sr,Ba,Zn)_2Si_{1-x}O_{4-2x}$: $Eu^{2+}$, wherein $0<x\leqq0.2$,
   a red emitting phosphor having peak emission in the range of about 610 to 660 nm, and
   an optional blue, green, or blue-green emitting phosphor having a peak emission in the range of about 440 to 550 nm.

2. The lighting apparatus of claim 1, wherein the light source is a semiconductor light emitting diode (LED) emitting radiation having a peak emission wavelength in the range of from about 250 to about 450 nm.

3. The lighting apparatus of claim 2, wherein said light emitting diode Comprises a nitride compound semiconductor represented by the formula $In_iGa_jAl_kN$, where $0\leqq i$; $0\leqq j$, $0\leqq k$, and $i+j+k=1$.

4. The lighting apparatus of claim 2, wherein said light emitting diode emits radiation having a peak wavelength in the range of from about 370 to about 440 nm.

5. The lighting apparatus of claim 1, wherein the light source is an organic emissive structure.

6. The lighting apparatus of claim 1, wherein the phosphor material is coated on a surface of the light source.

7. The lighting apparatus of claim 1, further comprising an encapsulant surrounding the light source and the phosphor material.

8. The lighting apparatus of claim 7, wherein the phosphor material is dispersed in the encapsulant.

9. The lighting apparatus of claim 1, further comprising a reflector cup.

10. The lighting apparatus of claim 1, wherein said yellow emitting phosphor comprises $Sr_{2-u-e}Ca_uEu_eSi_{1-x}O_{4-2x}$, where $0.25\leqq u\leqq0.50$, $0.01\leqq e\leqq0.06$ and $0.02\leqq x\leqq0.20$.

11. The lighting apparatus of claim 1, wherein said red emitting phosphor comprises a nitride phosphor doped with at least one of $Eu^{2+}$ and $Ce^{3+}$.

12. The lighting apparatus of claim 11, wherein said red emitting phosphor comprises at least one member of the group consisting of: $Ca_{1-a-b}Ce_aEu_bAl_{1+a}Si_{1-a}N_3$, where $0<a\leqq0.2$, $0\leqq b\leqq0.2$; $Ca_{1-c-d}Ce_cEu_dAl_{1-c}(Mg,Zn)_cSiN_3$, where $0<c\leqq0.2$, $0\leqq d\leqq0.2$; $Ca_{1-2e-f}Ce_e(Li,Na)_eEu_fAlSiN_3$, where $0\leqq e\leqq0.2$, $0\leqq f\leqq0.2$, $e+f>0$; and $Ca_{1-g-h-i}Ce_g(Li,Na)_hEu_iAl_{1+g-h}Si_{1-g+h}N_3$ where $0\leqq g\leqq0.2$, $0<h\leqq0.4$, $0\leqq i\leqq0.2$, $g+i>0$.

13. The lighting apparatus of claim 1, wherein said optional blue, green, or blue-green emitting phosphor comprises at least one of an alkaline earth haloapatite activated with $Eu^{2+}$ and an alkaline earth aluminate activated with $Eu^{2+}$.

14. The lighting apparatus of claim 1, wherein said phosphor material further comprises one or more additional phosphors.

15. The lighting apparatus of claim 1, where said lighting apparatus emits light having a CCT of less than 4500K.

16. The lighting apparatus of claim 15, where said lighting apparatus emits light having a CCT of less than 3500K.

17. The lighting apparatus of claim 15, wherein said apparatus has a lm/W value of greater than 30 with a CRI equal to or greater than 90.

18. The lighting apparatus of claim 15, wherein said apparatus has a lm/W value of greater than 40.

19. The lighting apparatus of claim 18, wherein the light source is a semiconductor light emitting diode (LED) emitting radiation having a peak emission wavelength in the range of from about 250 to about 450 nm.

20. The lighting apparatus of claim 18, wherein said yellow emitting phosphor comprises asilicate doped with at least one of $Eu^{2+}$ and $Ce^{3+}$.

21. The lighting apparatus of claim 18, wherein said at least one blue, green, or blue-green emitting phosphor comprises an alkaline earth haloapatite doped with $Eu^{2+}$.

22. The lighting apparatus of claim 18, where said lighting apparatus emits light having a CCT of less than 3500K.

23. The lighting apparatus of claim 21, wherein said apparatus has a lm/W value of greater than 30 with a CRI equal to or greater than 90.

24. The lighting apparatus of claim 1, wherein said apparatus has a lm/W value of greater than 40 lm/W.

25. A phosphor blend comprising i) a yellow emitting phosphor $(Mg,Ca,Sr,Ba,Zn)_2Si_{1-x}O_{4-2x}:Eu^{2+}$ (wherein $0<x\leqq0.2$), ii) a red emitting phosphor having peak emission in the range of about 610 to 660 nm, and iii) an optional blue, green, or blue-green emitting phosphor having peak emission in the range of about 440 to 550 nm.

* * * * *